US008232628B2

(12) United States Patent
Hesen et al.

(10) Patent No.: US 8,232,628 B2
(45) Date of Patent: Jul. 31, 2012

(54) METHOD FOR MANUFACTURING A MICROELECTRONIC PACKAGE COMPRISING AT LEAST ONE MICROELECTRONIC DEVICE

(75) Inventors: Paulus M. C. Hesen, Eindhoven (NL); Antonius J. G. M. van den Berk, Vught (NL); Richard van Lieshout, Batenburg (NL)

(73) Assignee: NXP B.V., Eindhoven (NL)

( * ) Notice: Subject to any disclaimer, the term of this patent is extended or adjusted under 35 U.S.C. 154(b) by 59 days.

(21) Appl. No.: 12/863,733

(22) PCT Filed: Dec. 30, 2008

(86) PCT No.: PCT/IB2008/055581
§ 371 (c)(1),
(2), (4) Date: Nov. 17, 2010

(87) PCT Pub. No.: WO2009/093109
PCT Pub. Date: Jul. 30, 2009

(65) Prior Publication Data
US 2011/0062565 A1 Mar. 17, 2011

(30) Foreign Application Priority Data

Jan. 22, 2008 (EP) .................................. 08100718

(51) Int. Cl.
*H01L 23/495* (2006.01)
(52) U.S. Cl. .................. 257/666; 257/99; 257/E23.031; 257/E21.499; 438/110; 438/123
(58) Field of Classification Search .................. 257/684, 257/704, 99, 100, 666, 685, E23.031, E21.499; 438/106, 110, 123
See application file for complete search history.

(56) References Cited

U.S. PATENT DOCUMENTS
6,972,482 B2 * 12/2005 Salta, III ....................... 257/686

FOREIGN PATENT DOCUMENTS
| EP | 0 626 723 A1 | 11/1994 | | |
|----|----|----|----|----|
| JP | 61 125138 A | 6/1986 | | |
| JP | 3-91947 | * | 4/1991 | .................... 257/693 |
| JP | 04 111437 A | 4/1992 | | |
| JP | 09 129659 A | 5/1997 | | |
| JP | 2001 085575 A | 3/2001 | | |

OTHER PUBLICATIONS

International Search Areport and Written Opinion for Application PCT/IB2008/055581 (December 30, 2008).

* cited by examiner

*Primary Examiner* — Jasmine Clark

(57) ABSTRACT

A method for manufacturing a microelectronic package (1) comprises the steps of providing two parts (13, 14) comprising electrically insulating material such as plastic; providing members (21, 22, 23) comprising electrically conductive material; providing a microelectronic device (30); positioning the electrically conductive members (21, 22, 23) and the microelectronic device (30) on the electrically insulating parts (13, 14); and placing the electrically insulating parts (13, 14) against each other, wherein the microelectronic device (30) and portions of the electrically conductive members (21, 22, 23) are sandwiched between the electrically insulating parts (13, 14). The electrically conductive members (21, 22, 23) are intended to be used for realizing contact of the microelectronic device (30) arranged inside the package (1) to the external world. An important advantage of the method having steps as mentioned is that the electrically conductive members (21, 22, 23) as such are provided, wherein it is not necessary to provide a conventional lead frame which has the disadvantage of causing considerable waste of metal material during its manufacturing process.

13 Claims, 1 Drawing Sheet

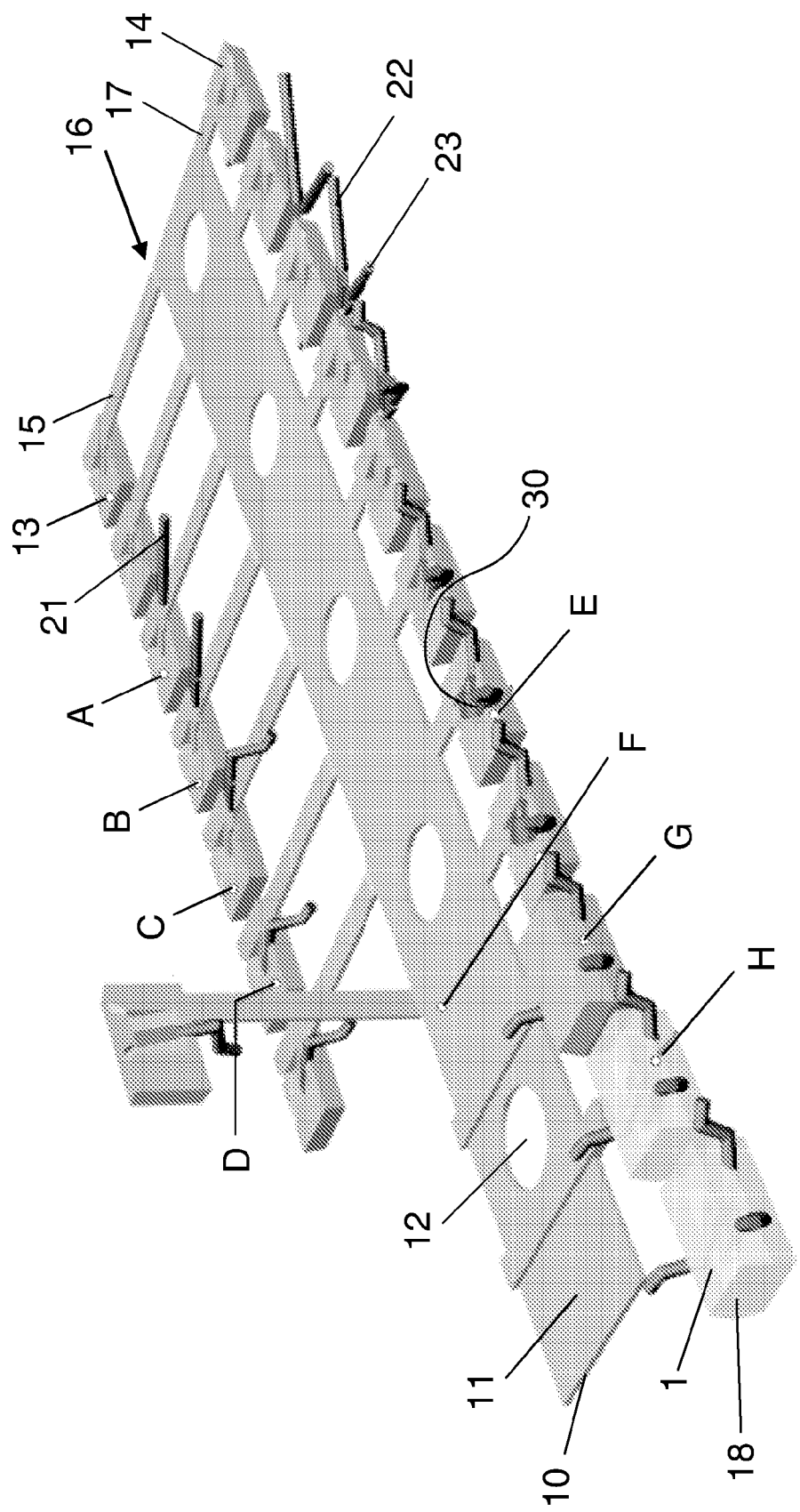

METHOD FOR MANUFACTURING A MICROELECTRONIC PACKAGE COMPRISING AT LEAST ONE MICROELECTRONIC DEVICE

FIELD OF THE INVENTION

The present invention relates to a method for manufacturing a microelectronic package comprising at least one microelectronic device such as a processor chip, a transistor, a sensor die, a diode, a Light Emitting Diode (LED), etc., and also to a microelectronic package.

BACKGROUND OF THE INVENTION

Microelectronic packages in which at least one microelectronic device is arranged are well-known, and various types of such packages have been developed. Among other things, the packages serve for protecting the microelectronic device and allowing for easy electrical connection of the microelectronic device to another device. Usually, dimensions of the microelectronic devices are in the micrometer range, and dimensions of the packages are in the millimeter range.

In general, for the purpose of supporting the microelectronic device and for ensuring that the microelectronic package has a required robustness, a carrier substrate is provided, wherein the microelectronic device is attached to the substrate. In a usual embodiment of the microelectronic package, a side of the carrier substrate where the microelectronic device is present is covered with material, wherein the microelectronic device is encapsulated in this material, whereas another side of the carrier substrate is freely accessible.

The carrier substrate is provided with electrically conductive tracks extending from the one side of the substrate to the other side of the substrate, in order to allow for electric contact from outside of the package to the microelectronic device. It is possible to have the electrically conductive tracks when a printed circuit board is provided, but in many cases, a metal lead frame, for example a copper lead frame, is provided for realizing these tracks. Such a lead frame is manufactured by providing a metal sheet, removing portions from this sheet and possibly bending this sheet in order to obtain a desired appearance of the lead frame. In practical cases, approximately ten times the sheet surface needed for forming the lead frame is thrown away when the lead frame is manufactured in this manner.

SUMMARY OF THE INVENTION

It is an objective of the present invention to provide a method for manufacturing a microelectronic package comprising at least one microelectronic device which is different from the above-described method in which a metal lead frame is used, in such an advantageous way that waste of metal material is avoided and lower costs are involved. This objective is achieved by a method which comprises the following steps:

providing two parts comprising electrically insulating material;

providing members comprising electrically conductive material, which are intended to serve as leads of the microelectronic package;

providing a microelectronic device;

positioning the electrically conductive members and the microelectronic device on the electrically insulating parts; and placing the electrically insulating parts against each other, wherein the microelectronic device and portions of the electrically conductive members are sandwiched between the electrically insulating parts.

When the method according to the present invention is applied, the application of a metal lead frame is omitted. Instead, parts comprising an electrically insulating material, such as plastic parts, which are very cheap in comparison with metal parts, are used, wherein separate electronically conductive members which are intended to serve as leads of the microelectronic package are provided. A connection between the microelectronic device and the electronically conductive members is established through portions of the electronically conductive members which are enclosed between the electrically insulating parts, together with the microelectronic device, whereas portions of the electronically conductive members extending outside of the closed whole of the electrically insulating parts enable establishment of electric contact of the microelectronic package to another device.

Preferably, in order to facilitate handling of the electrically insulating parts and positioning of the electrically insulating parts with respect to each other for forming a closed whole, the electrically insulating parts are part of a single carrier, wherein the electrically insulating parts are rotatably arranged with respect to each other over a folding line in the carrier. When a carrier as mentioned is provided and used, the step of placing the electrically insulating parts against each other involves rotating the electrically insulating parts towards each other over the folding line. In particular, the positioning of the electrically insulating parts with respect to the folding line may be such that the electrically insulating parts are automatically and accurately placed against each other when a folding action is performed.

Many existing microelectronic devices are so-called semiconductor devices which require an application of three members for electrically contacting the device to the outside world. In particular, in many cases, it is required to connect one member, which is often referred to as collector member to one side of the microelectronic device, and to connect the other two members, which are often referred to as base member and emitter member, to another side of the microelectronic device. In view of this fact, although in principle, any distribution of the electrically conductive members and the microelectronic device over the electrically insulating parts is possible, a practical way of carrying out the method according to the present invention comprises the steps of placing one electronically conductive member on one of the electrically insulating parts, placing two electrically conductive members and the microelectronic device on another of the electrically insulating parts, and placing the electrically insulating parts against each other, wherein the microelectronic device and portions of the electrically conductive members are sandwiched between the electrically insulating parts.

It is possible that electrical connections between the microelectronic device and the two electrically conductive members which are placed on the same electrically insulating part as the microelectronic device are established prior to placing the electrically insulating parts against each other, but it is also possible to establish all necessary connections between the microelectronic device and the electrically conductive members after the package has been closed. In any case, in the process of establishing the electrical connections, any suitable technique may be applied. For example, the microelectronic device may be provided with solder bumps, wherein the device is connected to the electrically conductive members through the bumps by performing a suitable solder technique.

In a practical embodiment, the electrically conductive members are strip sections or wire sections, for example, whether comprising an electrically insulating outer layer, or not, wherein a cross-section of the members may have any suitable shape, and may for example be circular or rectangular. A suitable material of the electrically conductive members is copper. In case an electrically insulating outer layer is present, it is necessary to take action aimed at removing this layer at a position where a connection to the microelectronic device needs to be established.

In case the electrically conductive members comprise strip sections or wire sections as described in the preceding paragraph, it is advantageous if the portions of the electrically conductive members which are sandwiched between the electrically insulating parts are flattened first. In the first place, height dimensions of the electrically insulating parts are decreased by flattening these parts, so that the dimensions of the microelectronic package may be as small as possible. In the second place, a top surface for establishing electric contact is increased.

Preferably, at least one electrically conductive member is bent. In this way, it is possible to ensure that in the microelectronic package, ends of the electrically conductive members, which serve for actually contacting another device, e.g. board mounting, are at an equal level extending beyond a closed body of the package, which is advantageous in practical cases.

When the method according to the present invention is applied, manufacturing a microelectronic package does not require manufacturing a lead frame. In stead, it is sufficient to only provide a number of electrically conductive members for the purpose of realizing a required number and type of members for allowing for electrically contacting the microelectronic device of the package from the outside, wherein there is no need for removal of material, as a shape and a size of the electrically conductive members may easily be adapted to the application of these members in the package.

According to the present invention, a lead frame is not required for the purpose of providing a package with a required robustness, as the electrically insulating parts are adapted to fulfill this function. As soon as the electrically insulating parts are placed against each other, and the at least one microelectronic device and the electrically conductive members are sandwiched between the parts, the positions of the microelectronic package and the electrically conductive members are fixed and the package is closed.

When the method according to the present invention is applied, a cost price of the microelectronic package is dramatically reduced, as only necessary components of the package are provided, wherein there is no need to apply a conventional process of manufacturing a lead frame by providing a sheet of material and removing portions of this sheet. It is possible that application of the method according to the present invention involves production of waste, namely in case the electrically insulating parts are part of a carrier, and this carrier comprises additional parts besides the electrically insulating parts. However, the additional parts may be manufactured from a cheap material such as plastic, so that the waste does not cause a noticeable addition to the cost prize of the microelectronic package.

According to the present invention, a method for manufacturing a number of microelectronic packages, which is suitable to be applied for the purpose of mass production of microelectronic packages, comprises the following steps:

providing a carrier having pairs of electrically insulating parts which are rotatably arranged with respect to each other over a folding line in the carrier;

providing a plurality of members comprising electrically conductive material, which are intended to serve as leads of the microelectronic packages;

providing a plurality of microelectronic devices;

forming microelectronic packages by positioning a number of electrically conductive members and at least one microelectronic device on the electrically insulating parts of each pair of electrically insulating parts; and placing the electrically insulating parts of the pairs of electrically insulating parts against each other by rotating the electrically insulating parts towards each other over the folding line, wherein the microelectronic device and portions of the electrically conductive members are sandwiched between the electrically insulating parts of the pairs of electrically insulating parts; and separating the microelectronic packages from the carrier.

According to this method, a carrier is applied, wherein the electrically insulating parts are arranged in pairs. For each pair of electrically insulating parts, the process of manufacturing a microelectronic package simply involves the steps of positioning at least one microelectronic device and a number of electrically conductive members needed as leads of the microelectronic package on the electrically insulating parts, placing the electrically insulating parts against each other, wherein the microelectronic device and portions of the electrically conductive members are sandwiched between the electrically insulating parts, and separating the microelectronic package from the carrier. The step of placing the electrically insulating parts against each other may be carried out in a simple and effective manner, namely by performing a folding action, during which the electrically insulating parts are moved towards each other until the parts have reached the correct mutual position, i.e. the position in which the package is closed and the microelectronic device and portions of the electrically conductive members are sandwiched between the electrically insulating parts.

Preferably, the steps of forming the microelectronic packages and separating the microelectronic packages from the carrier are successively carried out in successive pairs of electrically insulating parts of the carrier. By repeatedly carrying out the steps of forming the microelectronic package and separating the microelectronic package from the carrier in successively arranged pairs of electrically insulating parts, a continuous production of microelectronic packages may be realized. For sake of completeness, it is noted that it is a practical possibility to perform steps aimed at finishing the microelectronic packages, e.g. soldering or final plating, when the packages are still attached to the carrier. This way of doing is advantageous, as handling of the packages is much more convenient when the packages are still part of a larger whole.

The present invention further relates to a carrier which is intended to be used in a manufacturing process of a microelectronic package. In particular, as has been pointed out in the foregoing, the carrier comprises pairs of electrically insulating parts which are rotatably arranged with respect to each other over a folding line in the carrier. The carrier may be manufactured entirely from plastic, for example.

Advantageously, the carrier according to the present invention may comprise a central strip extending between the electrically insulating parts of the pairs of electrically insulating parts. In this embodiment, the carrier may comprise elongated, relatively narrow members for connecting electrically insulating parts of the pairs of electrically insulating parts to the central strip at one side of the strip, wherein the folding line is located between an end of the connecting members and the central strip. As the connecting members only have a small width dimension, folding is very easy in this embodiment of the carrier. Furthermore, the central strip may play a role in facilitating handling of the carrier. Preferably, the central strip is provided with a pattern of holes which may be engaged by members of a machine that is used in the process of manufacturing microelectronic packages on the basis of the carrier.

The present invention also relates to a microelectronic package, namely a microelectronic package comprising only the following components as functional components:
at least one microelectronic device;
a number of members comprising electrically conductive material for enabling the microelectronic device to be electrically contacted from outside of the package; and
two electrically insulating parts which are placed against each other, wherein the electrically conductive members and the microelectronic device are sandwiched between the electrically insulating parts.

As has already been noted, in comparison the manufacturing process of a conventional microelectronic package comprising a metal lead frame, the manufacturing process of the microelectronic package according to the present invention is significantly cheaper, due to the fact that there is no need for wasting any metal material, while the functionality of the microelectronic package is the same.

The above-described and other aspects of the present invention will be apparent from and elucidated with reference to the following description of a way of carrying out a method for manufacturing a microelectronic package according to the present invention.

BRIEF DESCRIPTION OF THE DRAWING

The present invention will now be explained in greater detail with reference to FIG. 1, which illustrates successive steps of a process of manufacturing a microelectronic package according to the present invention.

DETAILED DESCRIPTION OF AN EMBODIMENT

FIG. 1 illustrates successive steps of a process of manufacturing a microelectronic package 1 according to the present invention.

At the start of the manufacturing process of the microelectronic package 1, a carrier 10 is provided. Preferably, the carrier 10 comprises plastic, and is manufactured by applying injection molding techniques. In the shown example, the carrier 10 comprises an elongated central strip 11 which is provided with a pattern of holes 12. Furthermore, the carrier 10 comprises pairs of package parts 13, 14, wherein each of the package parts 13, 14 of the pairs of package parts 13, 14 is positioned at another side of the central strip 11. One of the package parts 13, 14 of each pair of package parts 13, 14 is connected to the central strip 11 through an elongated, relatively thin connecting member 15, wherein the whole of connecting member 15 and package part 13 is rotatably connected to the central strip 11, because at an end of the connecting member 15 which is actually connected to the central strip 11, a folding line 16 is present.

In the following, for sake of clarity, the package part 13 that is connected to the central strip 11 through the connecting member 15 as described will be referred to as lower package part 13, whereas the other package part 14 will be referred to as upper package part 14. It is noted that in the shown example, the upper package part 14 is also indirectly connected to the central strip 11, namely through a rather short connecting member 17. On the basis of this fact, a process of separating the upper package part 14 from the carrier 10 when the microelectronic package 1 is ready is facilitated.

In a first step of the manufacturing process of the microelectronic package 1, which is indicated by the letter A in FIG. 1, electrically conductive members 21, 22, 23 are provided. In the shown example, the electrically conductive members comprise metal wires 21, 22, 23.

In a second step of the manufacturing process of the microelectronic package 1, which is indicated by the letter B in FIG. 1, end portions of the wires 21, 22, 23, which are intended to be placed on the package parts 13, 14, are flattened.

In a third step of the manufacturing process of the microelectronic package 1, which is indicated by the letter C in FIG. 1, end portions of the wires 21, 22, 23, which are intended to be located at an outside of the microelectronic package 1, are bent. During the following steps of the manufacturing process, the wires 21, 22, 23 are preferably positioned such that, in the microelectronic package 1 to be formed, the end portions are located in a single imaginary plane, extending beyond a closed body of the microelectronic package 1, so that connection to the microelectronic package 1 at a single level is possible.

In a fourth step of the manufacturing process of the microelectronic package 1, which is indicated by the letter D in FIG. 1, the flattened end portions of the wires 21, 22, 23 are positioned on the package parts 13, 14. In the shown example, a total of three wires 21, 22, 23 per pair of package parts 13, 14 is provided, wherein the end portion of one wire 21 is placed on the lower package part 13, and wherein the end portions of two wires 22, 23 are placed on the upper package part 14. In particular, the package parts 13, 14 may be provided with recesses for receiving the end portions of the wires 21, 22, 23, wherein the recesses are preferably shaped such as to snugly enclose the end portions of the wires 21, 22, 23, so that the wires 21, 22, 23 are automatically put in a proper position with respect to the package parts 13, 14 when the end portions of the wires 21, 22, 23 are received in the recesses.

In a fifth step of the manufacturing process of the microelectronic package 1, which is indicated by the letter E in FIG. 1, a microelectronic device 30 is provided, and the microelectronic device 30 is placed on the end portions of the wires 22, 23 which are present on the upper package part 14. Also, electric connections between the microelectronic device 30 and end portions of the wires 22, 23 are established in any suitable manner. For example, the microelectronic device 30 may be provided with solder balls and a wafer-back coating, wherein the microelectronic device 30 is bonded onto the wires 22, 23 with a thermo-compression process, or the microelectronic device 30 may be provided with gold studs, wherein the microelectronic device 30 is bonded onto the wires 22, 23 through eutectic bonding. For sake of completeness, it is noted that in principle, it is also possible for the electric connections between the microelectronic device 30 and the wires 22, 23 to be established at a later stage.

Within the scope of the present invention, the microelectronic device 30 may be of any suitable type. For example, this device 30 may comprise a processor chip, a transistor, a sensor die, a diode, a LED, etc. Depending on the type of microelectronic device 30, the microelectronic package 1 may have various applications. For example, the microelectronic package 1 may be formed such as to function as a transistor.

In a sixth step of the manufacturing process of the microelectronic package 1, which is indicated by the letter F in FIG. 1, a folding action is performed, wherein the whole of lower package part 13 and connecting member 15 is rotated with respect to the central strip 11 of the carrier 10 over the folding line 16. The rotational movement is continued until the lower package part 13 is placed against the upper package part 14 in a seventh step of the manufacturing process of the microelectronic package, which is indicated by the letter G in FIG. 1. At that point, a closed body 18 is obtained, in which the microelectronic device 30 and end portion of the wires 21, 22, 23 connected thereto are enclosed, as these components of the microelectronic package 1 are sandwiched between the package parts 13, 14.

After the seventh step has been performed, the microelectronic package 1 is ready. The package 1 comprises a plastic body 18, a microelectronic device 30 that is safely accommodated inside the body 18, and wires 21, 22, 23 for enabling the establishment of electric connections to the microelectronic device 30 from outside of the body 18. The microelectronic device 30 may be a semiconductor device, wherein the one wire 21, which is arranged at the side of the lower package part 13 during the manufacturing process, serves as collector member that is connected to one side of the microelectronic device 30, and wherein the other two wires 22, 23, which are arranged at the side of the upper package part 14 during the manufacturing process, serve as base member and emitter member which are connected to another side of the microelectronic device 30.

In an eighth step of the manufacturing process of the microelectronic package 1, which is indicated by the letter H in FIG. 1, the package 1 which is ready is removed from the carrier 10. In the process, any suitable separating technique may be applied, for example, a cutting technique.

In the shown example, the carrier 10 is intended to be displaced one position of a pair of package parts 13, 14 at a time, wherein successive steps of the manufacturing process are performed simultaneously on successive pairs of package parts 13, 14. Displacement of the carrier 10 may be performed in any suitable manner, for example, by using movably arranged pins (not shown) which are positioned such as to be extending through the holes 12 which are present in the central portion 11 of the carrier 10, and which may be controlled such as to move the carrier 10 in discrete steps. On the basis of this way of manufacturing the microelectronic packages 1 in mass production, it is possible to apply a production line (now shown) having various stations for performing the various steps, wherein the stations are disposed in a line, and wherein portions of the microelectronic package 1 in the process of formation, which need to be processed are moved from one station to another by displacing the complete assembly with respect to the stations. In principle, other possibilities exist within the scope of the present invention, such as subjecting all of the pairs of package parts 13, 14 of a carrier 10 to one and the same process and varying the processes over time, but these possibilities appear to be less practical.

It is noted that the first three steps of the manufacturing process according to the present invention, i.e. the steps of providing the wires 21, 22, 23, flattening end portions of the wires 21, 22, 23, and bending other end portions of the wires 21, 22, 23 do not necessarily need to take place when the carrier 10 is already provided. It is very well possible to perform these steps at another time and place, just like the process of forming the carrier 10 does not necessarily need to take place directly prior to the other steps of the process of manufacturing the microelectronic packages 1. In such a case, the manufacturing process is performed in different stages, wherein, during one of the stages, the wires 21, 22, 23 are processed such as to be ready to be used in the microelectronic package 1 to be formed.

An important advantage of the above-described way of manufacturing microelectronic packages 1 is that members 21, 22, 23 which are arranged for the purpose of allowing for proper electric contact between the enclosed microelectronic device 30 and another device (not shown) such as a printed circuit board, and which are often referred to as leads 21, 22, 23, are obtained on the basis of the various wires 21, 22, 23. In this way, it is achieved that realizing the leads 21, 22, 23 does not involve a production of waste of electrically conductive material, which may be copper or another metal. Providing electrically conductive wires 21, 22, 23 and electrically insulating parts 13, 14 for supporting the wires 21, 22, 23 and keeping the wires 21, 22, 23 in predetermined mutual positions by clamping portions of the wires 21, 22, 23 is a cheap alternative to the conventional processes of manufacturing a lead frame, during which a metal sheet is provided and portions of this sheet are removed.

Another important advantage of the above-described way of manufacturing microelectronic packages 1 is that each of the wires 21, 22, 23 is directly connected to the proper side of the microelectronic device 30, and that the wires 21, 22, 23 may be bent in case it is desired to have free end portions of the wires 21, 22, 23 at a single level, as in this manner, there is no need for applying a more complicated method for establishing connections between the microelectronic device 30 and the wires 21, 22, 23, in particular a method known as wire bonding.

It will be clear to a person skilled in the art that the scope of the present invention is not limited to the example discussed in the foregoing, but that several amendments and modifications thereof are possible without deviating from the scope of the present invention as defined in the attached claims. While the present invention has been illustrated and described in detail in the figure and the description, such an illustration and description are to be considered illustrative or exemplary only, and not restrictive. The present invention is not limited to the disclosed embodiment.

Despite of the fact that the above-described example relates to a microelectronic package 1 having three leads 21, 22, 23, it is also possible that only two electrically conductive members 21, 22, 23 such as metal wires or strips are used. This may be the case when the microelectronic device 30 comprises a diode. Manufacturing packages having more than three leads 21, 22, 23 is also feasible within the scope of the present invention. Furthermore, it is noted that the leads 21, 22, 23 of the package 1 may be bent in such a way that the free end portions of the leads 21, 22, 23 fit on a conventional device such as a printed circuit board to which the package 1 is to be connected.

In the example as described on the basis of FIG. 1, only one microelectronic device 30 is enclosed between two package parts 13, 14 of a pair of package parts 13, 14. However, that does not alter the fact that one package 1 may comprise more than one microelectronic device 30 and electrically conductive members 21, 22, 23 connected thereto.

Variations to the disclosed embodiment can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the present invention.

In the foregoing, a method for manufacturing a microelectronic package 1 has been disclosed, which comprises the steps of providing two parts 13, 14 comprising electrically insulating material such as plastic; providing members 21, 22, 23 comprising electrically conductive material; providing a microelectronic device 30; positioning the electrically conductive members 21, 22, 23 and the microelectronic device 30 on the electrically insulating parts 13, 14; and placing the electrically insulating parts 13, 14 against each other, wherein the microelectronic device 30 and portions of the electrically conductive members 21, 22, 23 are sandwiched between the electrically insulating parts 13, 14. Preferably, the electrically insulating parts 13, 14 are part of a single carrier 10, wherein the electrically insulating parts 13, 14 are rotatably arranged with respect to each other over a folding line 16 in the carrier 10, and wherein the step of placing the electrically insulating parts 13, 14 against each other involves rotating the electrically insulating parts 13, 14 towards each other over the folding line 16. In such a case, handling of the electrically insulating parts 13, 14 and positioning the parts 13, 14 with respect to each other may take place in the most easy and accurate manner.

The electrically conductive members 21, 22, 23 are intended to function as leads of the microelectronic package 1, i.e. components which are used for realizing contact of the microelectronic device 30 arranged inside the package 1 to the external world. An important advantage of the method having steps as mentioned is that the leads 21, 22, 23 as such are provided, wherein it is not necessary to provide a conventional lead frame which, among other things, has the disadvantage of causing considerable waste of metal material during its manufacturing process.

Furthermore, the method offers the possibility of connecting the various electrically conductive members 21, 22, 23 to a proper side of the microelectronic device 30, so that the application of a relatively complicated connecting method such as wire bonding may be omitted.

The invention claimed is:

1. Method for manufacturing a microelectronic package, comprising the following steps: providing two parts comprising electrically insulating material;
   providing members comprising electrically conductive material, which are intended to serve as leads of the microelectronic package;
   providing a microelectronic device;
   positioning the electrically conductive members and the microelectronic device on the electrically insulating parts; and
   placing the electrically insulating parts against each other, wherein the microelectronic device and portions of the electrically conductive members are sandwiched between the electrically insulating parts; and
   wherein the electrically insulating parts are part of a single carrier,
   wherein the electrically insulating parts are rotatably arranged with respect to each other over a folding line in the carrier, and
   wherein the step of placing the electrically insulating parts against each other involves rotating the electrically insulating parts towards each other over the folding line.

2. Method according to claim 1, wherein the portions of the electrically conductive members which are sandwiched between the electrically insulating parts are flattened first.

3. Method according to claim 1, wherein at least one electrically conductive member is bent.

4. Method for manufacturing a number of microelectronic packages, comprising the following steps:
   providing a carrier having pairs of electrically insulating parts which are rotatably arranged with respect to each other over a folding line in the carrier;
   providing a plurality of members comprising electrically conductive material, which are intended to serve as leads of the microelectronic packages;
   providing a plurality of microelectronic devices;
   forming microelectronic packages by positioning a number of electrically conductive members and at least one microelectronic device on the electrically insulating parts of each pair of electrically insulating parts; and
   placing the electrically insulating parts of the pairs of electrically insulating parts against each other by rotating the electrically insulating parts towards each other over the folding line,
      wherein the microelectronic device and portions of the electrically conductive members are sandwiched between the electrically insulating parts of the pairs of electrically insulating parts; and
   separating the microelectronic packages from the carrier.

5. Method according to claim 4, wherein the steps of forming the microelectronic packages and separating the microelectronic packages from the carrier are successively carried out in successive pairs of electrically insulating parts of the carrier.

6. Method according to claim 4, wherein the portions of the electrically conductive members which are sandwiched between the electrically insulating parts of the pairs of electrically insulating parts are flattened first.

7. Method according to claim 4, wherein per pair of electrically insulating parts at least one electrically conductive member is bent.

8. Carrier which is intended to be used in a manufacturing process of a microelectronic package, comprising pairs of electrically insulating parts which are rotatably arranged with respect to each other over a folding line in the carrier; and a central strip extending between the electrically insulating parts of the pairs of electrically insulating parts.

9. Carrier according to claim 8, comprising elongated, relatively narrow members for connecting electrically insulating parts of the pairs of electrically insulating parts to the central strip at one side of the strip, wherein the folding line is located between an end of the connecting members and the central strip.

10. Carrier according to claim 8, wherein the central strip is provided with a pattern of holes.

11. Microelectronic package, comprising the following components as functional components:
   at least one microelectronic device;
   a number of continuous members comprising electrically conductive material, for enabling the microelectronic device to be electrically contacted from outside of the package, wherein each of the number of continuous members is directly bonded to the microelectronic device; and
   two electrically insulating parts which are placed against each other, wherein the electrically conductive members and the microelectronic device are sandwiched between the electrically insulating parts.

12. The microelectronics package according to claim 11, wherein the two electrically insulating parts comprise plastic.

13. Method for manufacturing a microelectronic package, comprising the following:
   providing two parts comprising electrically insulating material;
   providing a microelectronic device;
   providing continuous members comprising electrically conductive material, which serve as leads of the microelectronic package, wherein each of the continuous members is directly bonded to the microelectronic device;
   positioning the electrically conductive members and the microelectronic device on the electrically insulating parts; and
   placing the electrically insulating parts against each other, wherein the microelectronic device and portions of the electrically conductive members are sandwiched between the electrically insulating parts.

* * * * *